United States Patent
Chang et al.

(10) Patent No.: US 10,068,850 B2
(45) Date of Patent: Sep. 4, 2018

(54) TRENCH SILICIDE WITH SELF-ALIGNED CONTACT VIAS

(71) Applicant: International Business Machines Corporation, Armonk, NY (US)

(72) Inventors: Josephine B. Chang, Bedford Hills, NY (US); Michael A. Guillorn, Cold Springs, NY (US); Fei Liu, Yorktown Heights, NY (US); Adam M. Pyzyna, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/663,145

(22) Filed: Jul. 28, 2017

(65) Prior Publication Data

US 2017/0330830 A1 Nov. 16, 2017

Related U.S. Application Data

(62) Division of application No. 14/962,882, filed on Dec. 8, 2015, now Pat. No. 9,721,888.

(51) Int. Cl.
*H01L 23/528* (2006.01)
*H01L 23/532* (2006.01)
*H01L 23/522* (2006.01)
*H01L 29/45* (2006.01)
*H01L 21/8234* (2006.01)
(Continued)

(52) U.S. Cl.
CPC ...... *H01L 23/528* (2013.01); *H01L 21/02134* (2013.01); *H01L 21/02137* (2013.01); *H01L 21/7684* (2013.01); *H01L 21/7688* (2013.01); *H01L 21/76817* (2013.01); *H01L 21/76886* (2013.01); *H01L 21/76897* (2013.01); *H01L 21/823418* (2013.01); *H01L 21/823475* (2013.01); *H01L 23/485* (2013.01); *H01L 23/5226* (2013.01); *H01L 23/5329* (2013.01); *H01L 29/45* (2013.01)

(58) Field of Classification Search
CPC ............... H01L 23/528; H01L 23/485; H01L 21/02137; H01L 21/7684; H01L 21/7688; H01L 21/76817; H01L 23/5329; H01L 21/02134; H01L 21/823418; H01L 21/823475; H01L 29/45; H01L 21/76897; H01L 23/5226; H01L 21/76886
See application file for complete search history.

(56) References Cited

U.S. PATENT DOCUMENTS

| | | | |
|---|---|---|---|
| 6,893,957 B2 | 5/2005 | Trivedi et al. | |
| 9,105,490 B2 * | 8/2015 | Wang | H01L 29/66636 |

(Continued)

OTHER PUBLICATIONS

List of IBM Patents or Patent Applications Treated as Related Dated Jul. 28, 2017, 2 Pages.

*Primary Examiner* — David Vu
(74) *Attorney, Agent, or Firm* — Scully, Scott, Murphy & Presser, P.C.; Louis J. Percello, Esq.

(57) ABSTRACT

A modified trench metal-semiconductor alloy formation method involves depositing a layer of a printable dielectric or a sacrificial carbon material within a trench structure and over contact regions of a semiconductor device, and then selectively removing the printable dielectric or sacrificial carbon material to segment the trench and form plural contact vias. A metallization layer is formed within the contact vias and over the contact regions.

18 Claims, 2 Drawing Sheets

(51) Int. Cl.
    *H01L 23/485*    (2006.01)
    *H01L 21/768*    (2006.01)
    *H01L 21/02*      (2006.01)

(56) References Cited

U.S. PATENT DOCUMENTS

| | | |
|---|---|---|
| 2006/0246718 A1 | 11/2006 | Frohberg et al. |
| 2007/0102821 A1 | 5/2007 | Papa Rao |
| 2009/0163021 A1 | 6/2009 | Ryu |
| 2010/0117237 A1 | 5/2010 | Coolbaugh et al. |
| 2010/0176513 A1 | 7/2010 | Agarwala et al. |
| 2011/0117737 A1 | 5/2011 | Agarwala et al. |
| 2011/0212616 A1 | 9/2011 | Seidel et al. |
| 2015/0243544 A1 | 8/2015 | Alptekin |

\* cited by examiner

TRENCH SILICIDE WITH SELF-ALIGNED CONTACT VIAS

BACKGROUND

The present application relates generally to the fabrication of semiconductor devices, and more specifically to a trench metal-semiconductor alloy process with self-aligned contact vias.

State of the art integrated circuits include various metallic interconnections. The interconnections are typically provided by depositing a dielectric layer over a semiconductor substrate comprising the various components to be interconnected, and then etching via holes through the dielectric layer to form contacts with the contact regions of each component.

As device feature dimensions decrease, it becomes increasingly difficulty to achieve proper alignment of a large number of contact via holes. Thus, it would be advantageous to provide a robust metallization architecture and corresponding manufacturing process.

SUMMARY

In accordance with embodiments of the present application, disclosed is a method of making a semiconductor device. The method involves forming a dielectric layer over a semiconductor substrate and etching trenches in the dielectric layer to expose active regions in the substrate. The active regions are reacted with a metal-containing material to form contact regions such as silicide regions in the substrate. A layer of a printable dielectric or a sacrificial carbon material is deposited within the trenches and over the contact regions, and then portions of the printable dielectric layer or the sacrificial carbon layer are removed from within the trenches to form contact vias that expose portions of the contact regions. A metallization layer is formed within the contact vias over the contact regions.

A further method involves forming a printable dielectric layer or a sacrificial carbon layer within trenches disposed over contact regions of a semiconductor substrate, and removing portions of the printable dielectric layer or the sacrificial carbon layer within the trenches to form contact vias exposing portions of the contact regions. A metallization layer is formed within the contact vias and over the contact regions.

A semiconductor device includes a dielectric layer disposed over a semiconductor substrate and interconnects that extend through the dielectric layer. The interconnects make electrical contact with contact regions formed in the substrate. The interconnects are disposed in contact vias bounded in first dimension by the dielectric layer and in a second dimension orthogonal to the first dimension by a printable dielectric.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
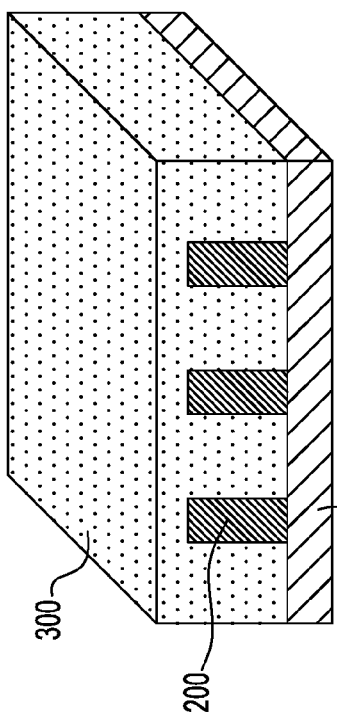
FIG. 1 is a simplified schematic diagram of a silicon MOSFET following a replacement metal gate (RMG) process.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a trench silicide process and corresponding structure having self-aligned contact vias. The trench silicide process can be used in conjunction with the manufacture of a semiconductor device, such as a field effect transistor (FET).

Although the present application provides details concerning forming contact structures at the source and drain regions of a field effect transistor (FET), the disclosed processes and resulting structures may provide electrical connections within other electrical devices including, but not limited to, memory devices, resistors, diodes, capacitors, and other semiconductor devices, such as FinFETs, Schottky barrier MOSFETS and bipolar junction transistors.

A field effect transistor (FET) is a semiconductor device that uses an electric field to control the electrical conductivity of a channel of one type of charge carrier in a semiconductor material. Field effect transistors can be majority charge carrier devices, in which the current is carried predominantly by majority carriers, or minority charge carrier devices, in which the current is mainly due to the flow of minority carriers. A typical device includes an active channel through which the charge carriers (e.g., electrons or holes) flow from a source to a drain. Source and drain terminal conductors are connected to the semiconductor through ohmic contacts. The conductivity of the channel, and hence the amount of current that flows across the transistor, is a function of the potential applied across the gate and source terminals.

As will be appreciated by those skilled in the art, a replacement metal gate (RMG) process may be used to manufacture the gate terminal of a field effect transistor. There exist a number of variations to the process, but they each typically include the formation of a sacrificial gate that is used as a place holder to define the location where a functional gate structure will eventually be formed. Source and drain junctions are defined using a combination of processes, which can be aligned to the sacrificial gate, including, for example, spacer formation, ion implantation, impurity diffusion, epitaxial growth, and silicide formation.

With the source and drain in place, high thermal budget steps such as dopant activation, surface cleans and epitaxial film growth, etc. can be performed before the functional gate materials are put in place.

During the process, a gap-fill dielectric is deposited, and the surface of the resulting structure is planarized so that the tops of the sacrificial gates are exposed. The sacrificial gate material is removed, which leaves trenches within the gap-fill dielectric. Thereafter, a functional gate structure including a gate dielectric and a gate electrode is formed within the trenches and the structure is planarized again to remove any gate stack materials not located inside the trench defined by the sacrificial gate. A "functional gate" as used herein refers to a permanent gate structure used to control output current (i.e., the flow of carriers through the channel) of a semiconductor device through electric or magnetic fields. A simplified schematic illustrating a silicon MOSFET after a replacement metal gate (RMG) process is shown in FIG. 1.

Illustrated in FIG. 1 is a substrate 100 having formed thereon functional gate structures 200 and a dielectric layer 300. The dielectric layer 300 has been planarized to a height above the tops of the gate structures 200. Substrate 100 may comprise channel regions, source regions, and drain regions. As is known, the source region is a portion of the substrate 100 that is located on a first side of each gate structure, while a drain is a portion of the substrate that is located on a second side of each gate structure, opposite the first side. The channel region is a portion of the substrate 100 located between the source and drain and located directly beneath each gate structure. The gate structures 200 are formed over respective channel regions.

Substrate 100 may be a semiconductor material such as silicon or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. Moreover, substrate 100 is not limited to silicon-containing materials, as the substrate 100 may comprise other semiconductor materials, including Ge and compound semiconductors such as GaAs, InAs and other like semiconductors. Although not depicted in FIG. 1, the substrate 100 may include layered semiconductors, such as Si/Ge and silicon-on-insulator (SOI) substrates.

The substrate 100 may include one or more doped regions, such as source and drain regions. A doped region may be formed in the substrate 100 by adding dopant atoms to an intrinsic semiconductor. This changes the electron and hole carrier concentrations of the intrinsic semiconductor at thermal equilibrium. A doped region may be p-type or n-type.

As used herein, "p-type" refers to the addition of impurities to an intrinsic semiconductor that creates a deficiency of valence electrons. In a silicon-containing substrate, example p-type dopants, i.e., impurities, include but are not limited to boron, aluminum, gallium, and indium. As used herein, "n-type" refers to the addition of impurities that contribute free electrons to an intrinsic semiconductor. In a silicon-containing substrate, example n-type dopants, i.e., impurities, include but are not limited to, antimony, arsenic, and phosphorus. The dopant(s) may be introduced by ion implantation or may be introduced to the substrate 100 in situ, i.e., during a process sequence used to form at least part of the substrate.

In example embodiments, a dopant region is implanted with arsenic or phosphorus to form an n-type semiconductor device such as an n-type field effect transistor (nFET). The dopant concentration within the dopant region may range from $1 \times 10^{18}$ atoms/cm$^3$ to $5 \times 10^{21}$ atoms/cm$^3$, e.g., $1 \times 10^{19}$ atoms/cm$^3$ to $1 \times 10^{20}$ atoms/cm$^3$.

In another example embodiment, a dopant region is implanted with boron or BF$_2$ to form a p-type semiconductor device such as a p-type field effect transistor (pFET). The dopant concentration within the dopant region may range from $1 \times 10^{18}$ atoms/cm$^3$ to $5 \times 10^{21}$ atoms/cm$^3$, e.g., $1 \times 10^{19}$ atoms/cm$^3$ to $1 \times 10^{29}$ atoms/cm$^3$.

Substrate 100 may comprise a single crystal material such as single crystal silicon. As used herein, the term "single crystal" denotes a crystalline solid, in which the crystal lattice of the entire sample is substantially continuous and substantially unbroken to the edges of the sample with substantially no grain boundaries. In various embodiments, the source and drain regions of the substrate 100 may comprise a polycrystalline material such as polysilicon.

The functional gate structure 200 includes a gate dielectric, and a gate electrode.

The gate dielectric may include silicon oxide, silicon nitride, a high-k dielectric, or other suitable material. A high-k dielectric may include a binary or ternary compound such as hafnium oxide (HfO$_2$). Further exemplary high-k dielectrics include, but are not limited to, ZrO$_2$, La$_2$O$_3$, Al$_2$O$_3$, TiO$_2$, SrTiO$_3$, BaTiO$_3$, LaAlO$_3$, Y$_2$O$_3$, HfO$_x$N$_y$, HfSiO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiO$_x$N$_y$, SiN$_x$, a silicate thereof, and an alloy thereof. Each value of x may independently vary from 0.5 to 3, and each value of y may independently vary from 0 to 2. The gate dielectric may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing.

The gate electrode may include a conductive material such as polysilicon, silicon-germanium, a conductive metal such as Ti, Ta, or W, or a conductive metal compound such as TiN, TiC, TiSiN, TiTaN, TaN, TaAlN, TaSiN, TaRuN, WSiN, NiSi, CoSi, as well as combinations thereof. The gate electrode may comprise one or more layers of such materials such as, for example, a metal stack including a work function metal layer and/or a liner. The gate electrode can be deposited using ALD, CVD, sputtering, or plating and may have a thickness ranging from 1 nm to 10 nm, e.g., 2 nm to 5 nm.

The conductive material may include, for example, Al, W, Cu, Pt, Ag, Au, Ru, Ir, Rh and Re, alloys of conductive metals, e.g., Al—Cu, silicides of a conductive metal, e.g., W silicide, and Pt silicide, and combinations thereof. The layer of conductive material can be formed utilizing a conventional deposition process such as, for example, ALD, CVD, metalorganic chemical vapor deposition (MOCVD), molecular beam epitaxy (MBE), PVD, plating, evaporation, ion beam deposition, electron beam deposition, laser assisted deposition, or chemical solution deposition.

A spacer may be in direct contact with sidewalls of the gate structure 200. The spacer may comprise a dielectric, such as a nitride, oxide, oxynitride, or a combination thereof. In one example, the spacer comprises silicon nitride. The spacer typically has a width ranging from 2 nm to 15 nm, as measured from the sidewall of the gate structure. The spacer may be formed by using a blanket layer deposition, such as chemical vapor deposition, followed by anisotropic etch-back.

The gate dielectric and the gate conductor of the gate structures 200 are disposed over channels regions. Source regions and drain region are arranged on opposing sides of the channel. Each of the source region and the drain region may include an extension dopant region and a deep dopant region (not shown). Typically, the dopant concentration of the extension dopant region having a p-type or n-type dopant ranges from $5\times10^{19}$ atoms/cm$^3$ to $5\times10^{20}$ atoms/cm$^3$.

Dielectric layer 300 is formed over the substrate 100. The dielectric layer 300 may comprise any dielectric material including but not limited to oxides, nitrides, oxynitrides, and combinations thereof. In one example, the dielectric layer is silicon nitride. In a further example, the dielectric layer 300 is silicon oxide ($SiO_2$). Other examples of materials that are suitable for the dielectric layer 300 include silicon-containing dielectric materials such as $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Still further additional materials for the dielectric layer 300 include any of the aforementioned materials in porous form, or in a form that changes during processing to or from being porous and/or permeable to being non-porous and/or non-permeable. The dielectric layer 300 may have a thickness ranging from 20 nm to 100 nm.

Figure 2:
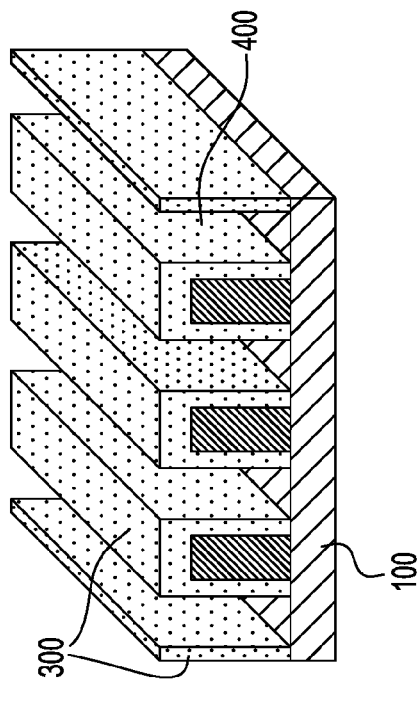
FIG. 2 shows the etching of trenches through a dielectric layer to exposure substrate active regions in the MOSFET structure of FIG. 1.

Referring to FIG. 2, trench openings 400 are formed in the dielectric layer 300 exposing source regions and drain regions in the substrate. The trench openings 400, which may be parallel to one another, may have a width ranging from 10 nm to 60 nm, e.g., 10, 20, 30, 40, 50 or 60 nm, including ranges between any of the foregoing values.

As used herein, a "trench" is a long, narrow structure having a length that is at least twice its width, while a "via" is a structure having a length that is less than twice its width. The trench openings may be formed using photolithography and etch processes. For example, a photoresist etch mask can be produced by applying a photoresist layer to the upper surface of the dielectric layer 300, exposing the photoresist layer to a pattern of radiation, and then developing the pattern into the photoresist layer utilizing a resist developer. The photoresist etch mask may be patterned so that portions of the dielectric layer that overlie source and drain regions are not protected by the photoresist etch mask in order to provide the trench openings 400.

Exposed portions of the dielectric layer 300 are then removed by a selective etch. The selective etch may be an anisotropic etch or an isotropic etch. In one embodiment, the etch chemistry for forming the trench openings to the source region and drain region comprises a fluorine-based chemical, such as $CF_4$, $CClF_2$, $SF_6$, or combinations thereof.

Figure 3:
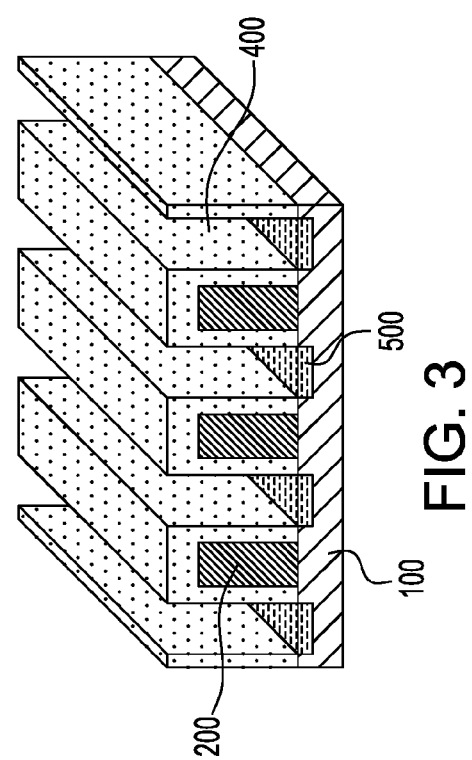
FIG. 3 shows the formation of contact regions within the substrate at the base of the trenches.

When forming a semiconductor device using a replacement metal gate process, conductive contacts to the source and drain regions are typically formed after cutting the trenches 400. FIG. 3 shows the formation of contact regions 500 on and within the substrate 100 at the base of each trench 400. In embodiments, the contact regions extend at least partially into the source and drain regions of the substrate 100.

Contact regions may be formed in situ via a reaction between the semiconductor material of the substrate and a metal-containing material. According to an illustrative process, a metal-containing layer is deposited at least on exposed surfaces of the source and drain regions. The metal-containing material may be deposited using physical vapor deposition (PVD) methods or chemical vapor deposition (CVD) methods. Examples of physical vapor deposition (PVD) methods that are suitable for forming the metal-containing layer include sputtering and plating.

As used herein, "sputtering" refers to a physical method of depositing a material layer on a surface. A target of the desired material, i.e., a source target, is bombarded with energetic particles (e.g., ions) that ablate atoms from the target. The dislodged target material deposits on the surface. Examples of sputtering apparatuses include DC diode systems, radio frequency (RF) systems, magnetron sputtering, and ionized metal plasma (IMP) sputtering. In various embodiments, the metal-containing material may comprise nickel, cobalt, tungsten, titanium, tantalum, aluminum, or platinum, as well as combinations and alloys thereof. The metal-containing layer may have a thickness ranging from 5 nm to 20 nm.

Following deposition, the semiconductor-metal-containing material interface is subjected to an annealing step including, but not limited to, rapid thermal annealing (RTA). During annealing, the deposited metal-containing material reacts (i.e., alloys) with the semiconductor material proximate the surface of the source and drain regions to form a contact region 500 at an upper surface of the substrate. In one embodiment, the anneal temperature ranges from 350° C. to 600° C., and the anneal time ranges from 1 second to 90 seconds. With rapid thermal annealing, a heating rate from room temperature (~23° C.) to the anneal temperature is at least 100° C./sec. A heat source for rapid thermal annealing may be an infrared lamp or a laser. Reacted portions of the metal-containing layer form a self-aligned contact region. Following the thermal anneal, non-reacted portions of the metal-containing layer are removed. The non-reacted portions of the metal-containing layer may be removed by an etch process that is selective to the alloyed material of the contact region. Contact regions 500 may comprise a metal-semiconductor alloy such as a metal silicide or a metal germanide.

The foregoing trench metal-semiconductor alloy formation process may be used in conjunction with replacement metal gate processes to postpone metal-semiconductor alloy formation until after a high-temperature gate stack anneal. By employing a sacrificial gate, the thermal budget that is applied to the functional gate structure may be decreased. Trench metal-semiconductor alloy formation is typically followed by trench metallization to form contact bar structures that connect the metal-semiconductor alloy contacts at the bottom of the trenches to further metallization provided later at the top of the trench.

According to embodiments of the present application, prior to metallization the trench openings are segmented using a printable dielectric or sacrificial carbon layer to form contact vias 610 that are aligned with the contact regions 500 formed in the substrate.

As used herein, a "printable dielectric material" refers to a class of photosensitive materials that can be coated as a self-planarizing material layer, and subsequently cross-linked into a dielectric material using a lithographic process. A printable dielectric material can comprise a polymer that can become crosslinked during the lithographic exposure. The lithographic process can include, for example, 193 nm photolithography, extreme UV lithography (EUV), or electron beam lithography.

Exemplary printable dielectric materials include, but are not limited to, hydrogen silsesquioxane (HSQ) and HSQbased materials, which are cross-linked into SiO$_2$ under electron beam or EUV exposure, and methyl silsesquioxane (MSQ) and MSQ-based materials which are cross-linked into organosilicate glass (OSG) including Si, C, O, and H by 193 nm photolithography or EUV lithography. Organosilicate glass is also referred to as a SiCOH dielectric.

As used herein, a "sacrificial carbon material" refers to an amorphous carbon material. A layer of sacrificial carbon may be deposited using, for example, a chemical vapor deposition process. A layer of sacrificial carbon may be patterned using conventional lithography and etching using, for example, an ashing process. Ashing may involve exposure to an oxygen-containing plasma.

Figure 4:
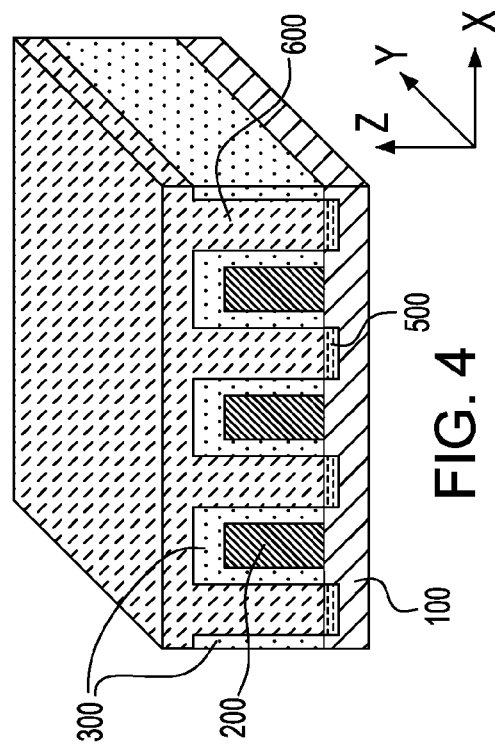
FIG. 4 shows deposition of a printable dielectric layer (or sacrificial carbon layer) over the dielectric layer and within the trenches directly over the contact regions.
Figure 5:
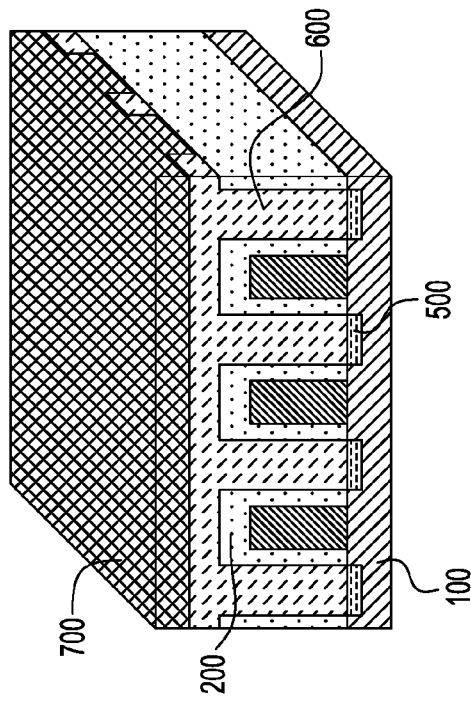
FIG. 5 shows removal of portions of the printable dielectric layer (or sacrificial carbon layer) to expose the contact regions and form contact vias.

Thus, prior to trench metallization, FIG. 4 shows the deposition of a printable dielectric layer or sacrificial carbon layer 600 within the trenches 400, over the contact regions 500, and over the dielectric layer 300. In embodiments, the printable dielectric layer or sacrificial carbon layer 600 is deposited directly on the contact regions 500. The printable dielectric layer or sacrificial carbon layer 600 is then patterned and etched to expose the contact regions 500 at the bottom of each newly-formed contact via 610. Contact vias 610 may be formed through the printable dielectric 600 and the dielectric layer 300 to expose an upper surface of the substrate in which the source region and the drain region are present. FIG. 5 illustrates a perspective view of the resultant structure following the formation of the contact vias 610.

In embodiments, contact vias 610 are formed by spinning-on a printable dielectric material such as those described above. In areas where contact vias 610 are not desired, the printable dielectric is cross-linked through a lithographic process such as electron beam lithography, EUV, or 193 nm photolithography. Any printable dielectric material which is not cross-linked is removed with a developer that removes uncross-linked material selectively to cross-linked material. An example of a developer suitable for HSQ is dilute tetramethylammonium hydroxide (TMAH).

According to embodiments, while portions of the printable dielectric 600 are removed to form contact vias 610, the printable dielectric layer 600 need not be entirely removed from within the trenches. Portions of the printable dielectric layer that are crosslinked can be retained and incorporated into the final device structure.

By segmenting trenches 400 into discrete contact vias 610, the volume of fill metal relative to the total trench volume can be substantially decreased and, in embodiments, contact bars may be effectively replaced with interconnects 710. This results in an attendant decrease in the associated capacitance. Insomuch as the trenches 400 are aligned with contact regions 500, the contact vias 610 will be aligned with the contact regions 500, which beneficially enhances the robustness of the process and avoids parasitic series resistance which would result from misalignment of contact vias to the bottom of the trench.

Figure 6:
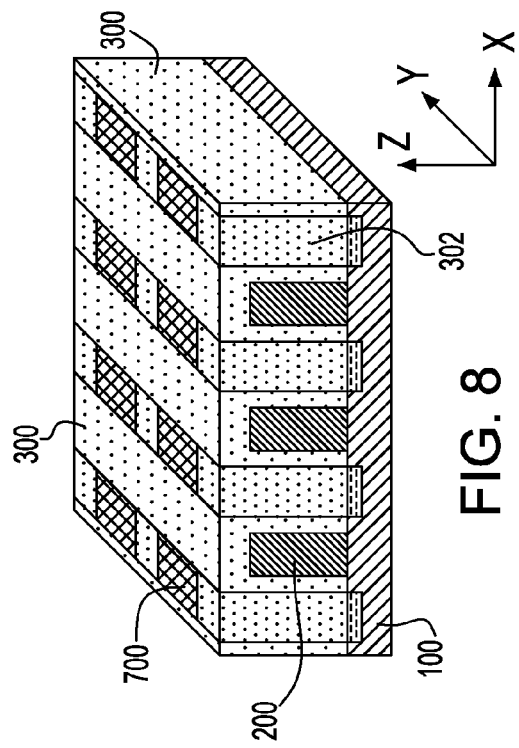
FIG. 6 shows formation of a metallization layer within the contact vias and over the exposed contact regions.

FIG. 6 shows formation of a metallization layer 700 over the exposed contact regions 500 within contact vias 610. Deposition of the metallization layer 700 within contact vias 610 defines interconnects 710. The metallization layer 700 may comprise any electrically conductive material. "Electrically conductive" as used through the present disclosure means a material having a room temperature electrical conductivity of at least $10^{-8}(\Omega\text{-m})^{-1}$.

The metallization layer 700 may be formed in direct contact with contact regions 500. The metallization layer 700 is formed by depositing a conductive metal into the via openings 610 using a deposition process such as physical vapor deposition (PVD). Examples of physical vapor deposition (PVD) that are suitable for forming the metallization layer include sputtering and plating. The metallization layer 700 may also be formed using chemical vapor deposition. Examples of materials that are suitable for the metallization layer include metals and doped semiconductors. For example, in various embodiments, the metallization layer 700 may comprise tungsten, copper, titanium, tantalum, nickel, cobalt, silver, aluminum, platinum, and gold, as well as combinations and alloys thereof. Electrical contact between the metallization layer and the source/drain regions of the substrate are provided by the contact regions.

Figure 7:
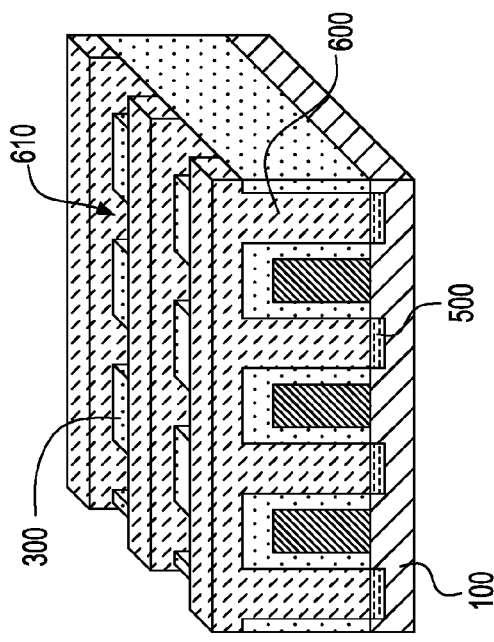
FIG. 7 shows planarization of the metallization layer revealing interconnects that are defined within the trenches transversely by the dielectric layer and longitudinally by the printable dielectric layer (or sacrificial carbon layer)

With reference to FIG. 7, following deposition, the metallization layer 700 is planarized to remove the metallization (overburden) that extends above the top of the dielectric layer. "Planarization" is a material removal process that employs at least mechanical forces, such as frictional media, to produce a substantially two-dimensional surface. In embodiments, the planarization process includes chemical mechanical polishing (CMP) or grinding. Chemical mechanical planarization (CMP) is a material removal process that uses both chemical reactions and mechanical forces to remove material and planarize a surface. In embodiments, as will be appreciated by those skilled in the art, planarization of the excess metallization is a Damascene process.

The planarized structure of FIG. 7 reveals how the printable dielectric defines the longitudinal sides of the contact vias, while the patterned dielectric layer 300 defines the transverse sides. Thus, in embodiments, interconnects 710 are in direct contact with contact regions 500, dielectric layer 300 and the printable dielectric 600.

In embodiments, the width (W) of the interconnects 710 is approximately equal to the trench width, while the length (L) of the interconnects 710 may be less than, equal to, or greater than the trench width. The interconnect width (W) may range from 10 nm to 60 nm, e.g., 10, 20, 30, 40, 50 or 60 nm, including ranges between any of the foregoing values. The interconnect length (L) may range from 10 nm to 200 nm, e.g., 10, 20, 50, 100, 150 or 200 nm, including ranges between any of the foregoing values.

In embodiments, the printable dielectric or sacrificial carbon may occupy 10 to 90% of the volume of trenches 400, e.g., 10, 20, 30, 40, 50, 60, 70, 80 or 90%, including ranges between any of the foregoing values. In related embodiments, the printable dielectric or sacrificial carbon may occupy 10 to 90% of the planar area of trenches 400, i.e., the area in the x-y plane of FIG. 7 e.g., 10, 20, 30, 40, 50, 60, 70, 80 or 90%, including ranges between any of the foregoing values.

Figure 8:
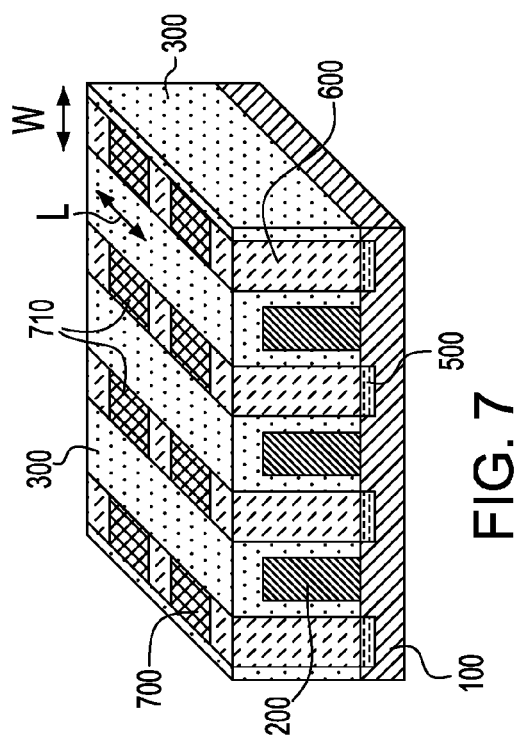
FIG. 8 shows the structure of FIG. 7 after replacement of the sacrificial carbon layer with a dielectric layer.

A further embodiment is illustrated in FIG. 8, where following trench metallization, the sacrificial carbon layer 600 disposed within trenches 400 and used to define contact vias 610 is removed and replace with replacement dielectric 302.

Disclosed is the use of a printable dielectric or sacrificial carbon layer to modify (decrease) the volume of metallization trenches during the manufacture of semiconductor devices.

As used herein, the singular forms "a," "an" and "the" include plural referents unless the context clearly dictates otherwise. Thus, for example, reference to a "printable dielectric" includes examples having two or more such "printable dielectrics" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a gate dielectric that comprises hafnium oxide include embodiments where gate electrode consists essentially of hafnium oxide and embodiments where gate electrode consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A semiconductor device, comprising:
   a dielectric layer disposed over a semiconductor substrate; and
   interconnects extending through the dielectric layer, the interconnects making electrical contact with contact regions in the substrate, wherein the interconnects are bounded in a first dimension by the dielectric layer and in a second dimension orthogonal to the first dimension by a printable dielectric.

2. The semiconductor device of claim 1, wherein the interconnects are disposed in trenches and are defined within the trenches transversely by the dielectric layer and longitudinally by the printable dielectric.

3. The semiconductor device of claim 1, wherein the interconnects have a width of 10 nm to 60 nm and a length of 10 nm to 200 nm.

4. The semiconductor device of claim 1, wherein the printable dielectric comprises a hydrogen silsesquioxane material or a methyl silsesquioxane material.

5. The semiconductor device of claim 1, wherein the contact regions are comprise a source/drain region of a field effect transistor.

6. The semiconductor device of claim 5, wherein the field effect transistor comprises a functional gate structure.

7. The semiconductor device of claim 1, wherein the dielectric material has a topmost surface that is coplanar with a topmost surface of the printable dielectric.

8. The semiconductor device of claim 7, wherein the topmost surface of the dielectric material is coplanar with a topmost surface of the interconnects.

9. The semiconductor device of claim 1, wherein the interconnects comprise an electrically conductive material.

10. The semiconductor device of claim 9, wherein the electrically conductive material tungsten, copper, titanium, tantalum, nickel, cobalt, silver, aluminum, platinum or gold.

11. The semiconductor device of claim 1, wherein the dielectric material comprises a silicon-containing dielectric material.

12. The semiconductor device of claim 1, wherein the dielectric material comprises a germanium containing dielectric material.

13. The semiconductor device of claim 1, wherein the dielectric material is porous.

14. The semiconductor device of claim 1, wherein the contact regions comprise a metal semiconductor alloy.

15. The semiconductor device of claim 1, wherein the printable dielectric material is a crosslinked dielectric material.

16. A semiconductor device, comprising:
    a functional gate structure located on a surface of a semiconductor substrate;
    a dielectric layer surrounding and located above the functional gate structure; and
    interconnects extending through the dielectric layer, the interconnects making electrical contact with contact regions located in the substrate and on opposing sides of the functional gate structure, wherein the interconnects are bounded in a first dimension by the dielectric layer and in a second dimension orthogonal to the first dimension by a printable dielectric.

17. The semiconductor device of claim 16, wherein the dielectric material has a topmost surface that is coplanar with a topmost surface of the printable dielectric.

18. The semiconductor device of claim 17, wherein the topmost surface of the dielectric material is coplanar with a topmost surface of the interconnects.

* * * * *